US008686790B2

(12) United States Patent
Safavi-Naeini et al.

(10) Patent No.: US 8,686,790 B2
(45) Date of Patent: Apr. 1, 2014

(54) DISTRIBUTED AMPLIFIER FOR BAND PASS RADIO FRONT-END

(75) Inventors: Safieddin Safavi-Naeini, Waterloo (CA); Mahmoud Mohammad-Taheri, Kitchener (CA); Ying Wang, Waterloo (CA); Mehrdad Fahimnia, Waterloo (CA)

(73) Assignee: BlackBerry Limited, Waterloo, Ontario (CA)

( * ) Notice: Subject to any disclaimer, the term of this patent is extended or adjusted under 35 U.S.C. 154(b) by 67 days.

(21) Appl. No.: 13/388,852

(22) PCT Filed: Aug. 5, 2010

(86) PCT No.: PCT/CA2010/001218
§ 371 (c)(1),
(2), (4) Date: Apr. 16, 2012

(87) PCT Pub. No.: WO2011/014961
PCT Pub. Date: Feb. 10, 2011

(65) Prior Publication Data
US 2012/0194267 A1      Aug. 2, 2012

Related U.S. Application Data

(60) Provisional application No. 61/213,986, filed on Aug. 5, 2009.

(51) Int. Cl.
*H03F 3/60* (2006.01)
(52) U.S. Cl.
USPC ............................................ 330/54; 330/286

(58) Field of Classification Search
USPC ................................ 330/54, 286, 124 R, 295
See application file for complete search history.

(56) References Cited

U.S. PATENT DOCUMENTS

| 4,733,195 A | 3/1988 | Tserng et al. |
| 4,797,628 A * | 1/1989 | Gruchalla et al. ............... 330/54 |
| 5,081,706 A * | 1/1992 | Kim ................................. 455/78 |
| 7,276,972 B2 * | 10/2007 | Kosugi et al. .................. 330/286 |
| 2006/0125556 A1 | 6/2006 | Suzuki |

OTHER PUBLICATIONS

Moazzam et al. "A High Gain Dual-Fed Single Stage Distributed Amplifier" Microwave Symposium Digest, 1994 IEEE MIT-S International San Diego, CA, USA, May 23-27, 1994, New York, NY, USA, IEEE, May 23, 1994, pp. 1409-1412 XP010586376.
Corresponding European Patent Application No. 10805920.5 Search Report dated Apr. 29, 2013.

* cited by examiner

*Primary Examiner* — Henry Choe
(74) *Attorney, Agent, or Firm* — Perry + Currier

(57) ABSTRACT

A distributed amplifier is provided that is broadband and band pass with controllable bandwidth. In the distributed amplifier circuit, termination impedance of the input transmission line is not matched with the characteristics impedance of the input transmission line and/or the termination impedance of the output transmission line is not matched with the characteristics impedance of the output transmission line, thus providing the broadband and band pass with controllable bandwidth attributes.

13 Claims, 4 Drawing Sheets

(a)                    (b)

DISTRIBUTED AMPLIFIER FOR BAND PASS RADIO FRONT-END

PRIORITY

This application claims priority to U.S. provisional patent application No. 61/213,986, filed on Aug. 5, 2009.

FIELD OF THE INVENTION

The present invention relates generally to distributed amplification. The present invention relates more specifically to distributed amplifiers for use in broadband network components.

BACKGROUND TO THE INVENTION

Distributed amplification is the amplification of portions of a signal along the length of a first (input) transmission line by either discrete active elements (amplifiers) or microwave/milometer-wave integrated circuit technology (MIMIC), the outputs of which are combined along a second (output) transmission line to produce the resultant amplified signal.

Conventional distributed amplifiers (CDAs) are commonly used for example in ultra-broadband communications and radio imaging systems due to their inherent high gain bandwidth properties which arise due to high cut off frequency associated with the transmission line structure of amplifier. CDAs have been widely and successfully investigated and implemented for more than three decades in various applications for both hybrid and monolithic technologies. Due to flat gain, uniform group delay and low noise figure over a large frequency band, distributed amplifiers (DA) are a good candidate for ultra-broadband low noise amplifiers in for example millimeter wave receivers. Theoretically by using a properly designed transmission line, infinite bandwidth can obtain with no limitation on gain. However, due to loss associated with transmission line implemented in a CDA structure, bandwidth is limited to cut off frequency of the transmission line formed by inductors and parasitic capacitors of transistors and pieces of microstrip or a coplanar waveguide. FIG. 1 shows a representative schematic of a CDA.

By proper choice of gate and drain inductors one can derive:

$$\sqrt{\frac{L_g}{C_{gs}}} = \sqrt{\frac{L_d}{C_{ds} + C_a}} = Z_0 \quad (1)$$

where $Z_0$ is transmission line characteristic impedance which is usually 50Ω, $C_{gs}$ and $C_{ds}$ are gate-to-source and drain-to-source capacitances and $C_a$ is a shunt capacitance connected to the drain of each transistor to synchronize the gate and drain transmission lines. For signals amplified by each transistor arrive in phase to output, the phase velocities of gate and drain line should be equal. This means:

$$\sqrt{L_g C_{gs}} = \sqrt{L_d(C_{ds} + C_a)} \quad (2)$$

From (1) and (2), we can conclude that $L_g = L_d$. The signals travelling in left direction in the drain line are out of phase and cancel out or are absorbed in termination impedance of $R_d = Z_0$. In the gate line, the signal is absorbed in the gate termination impedance when $R_g = Z_0$. The resulting amplifier has low pass frequency response.

The cut off frequency of CDA, can be expressed as:

$$f_c = \frac{1}{\pi\sqrt{L_g C_{gs}}} = \frac{1}{\pi Z_0 C_{gs}}$$

The main disadvantage of CDA is low frequency range of operation due to the cut-off frequency of the transmission line associated with the amplifier.

There is a need for a distributed amplifier design, and distributed amplifiers based on such design, that address the aforesaid disadvantages.

SUMMARY

A distributed amplifier is provided, including a novel distributed amplifier topology. The distributed amplifier of the present invention is broadband and band pass with controllable bandwidth.

The distributed amplifier of the present invention includes one or more unit cells each having amplifying characteristics, characterized in that the termination impedance of the input transmission line is not matched with the characteristics impedance of the input transmission line; and/or the termination impedance of the output transmission line is not matched with the characteristics impedance of the output transmission line, such that the distributed amplifier is broadband and band pass with controllable bandwidth.

More specifically, in a particular aspect of the invention, the termination impedance of the input transmission line is less than the characteristics impedance of the input transmission line; and/or the termination impedance of the output transmission line is less than the characteristics impedance of the output transmission line.

For clarity, the termination impedance/characteristics impedance attributes may be applied to the input transmission line, the output transmission line, or both, depending on the application.

In another aspect of the present invention the distributed amplifier includes at least one short circuit for signal termination disposed at the end of the input transmission line, the output transmission line, or both.

In one aspect of the present invention, a distributed amplifier circuit is provided based on a standing wave amplifier construction.

In yet another aspect of the invention, each of the unit cells includes at least one transistor, each such transistor including one or more parasitic capacitors, and wherein such parasitic capacitors are absorbed on each of the input transmission line and the output transmission line so as to provide a large bandwidth transmission line.

In a still other aspect of the invention, the bandwidth of the distributed amplifier is determined by the cut-off frequency of the input transmission line and the output transmission line based on the termination(s) of the distributed amplifier.

In yet another aspect of the invention, the bandwidth of the distributed amplifier is controllable including through the selection of the termination(s), in addition to other known control means.

In another aspect of the invention, the following theory of operation is embodied in the distributed amplifier of this invention: a signal is injected to the input transmission line; the signal travels to each unit cell; and the signal is amplified in each unit cell by addition in travelling in the forward direction toward a circuit output so as to generate an amplified output signal; the signal is also reflected by the termination disposed on the input transmission line back to its input transmission line, thereby adding up to the injected signal; and/or the signal travels in the reverse direction along the output transmission line, and is reflected by the termination disposed on the output transmission line back to its output transmission line thereby further adding up to output signal. This provides improved gain and noise performance and reduces power consumption.

In another aspect of the invention, the distributed amplifier circuit produces a signal with substantially less attenuation thereby providing less attenuation at the termination(s).

Significantly, the stronger output signal and injected signal enables the reduction of the number of unit cells required for gain and bandwidth requirements. This provides reduction of circuit components and lowers costs.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

DETAILED DESCRIPTION

The present invention provides a new band pass distributed amplifier. The present invention provides a design for a distributed amplifier, best understood by reference to the circuit topology shown in FIG. 2. Significantly, the distributed amplifier of the present invention is both broadband and band pass with controllable bandwidth.

The inventors discovered that a band pass distributed amplifier topology can be realized when $R_d < Z_0$ and $R_g < Z_0$, as further explained below, which then provides improved circuit characteristics as described herein.

Terminations were seen as an essential part of conventional distributed amplifiers, however, the termination impedances in prior art distributed amplifiers resulted in significant noise, limited gain and less desirable power characteristics.

The present invention resolves termination differently than prior art technologies and methods. Contrary to prior art solutions, termination impedance of the input transmission line is not matched with the characteristics impedance of the input transmission line; and/or the termination impedance of the output transmission line is not matched with the characteristics impedance of the output transmission line, such that the distributed amplifier is broadband and band pass with controllable bandwidth. For certain applications, the termination impedance of the input transmission line is less than the characteristics impedance of the input transmission line; and/or the termination impedance of the output transmission line is less than the characteristics impedance of the output transmission line.

For clarity, the termination impedance/characteristics impedance attributes may be applied to the input transmission line, the output transmission line, or both, depending on the application.

Figure 4:
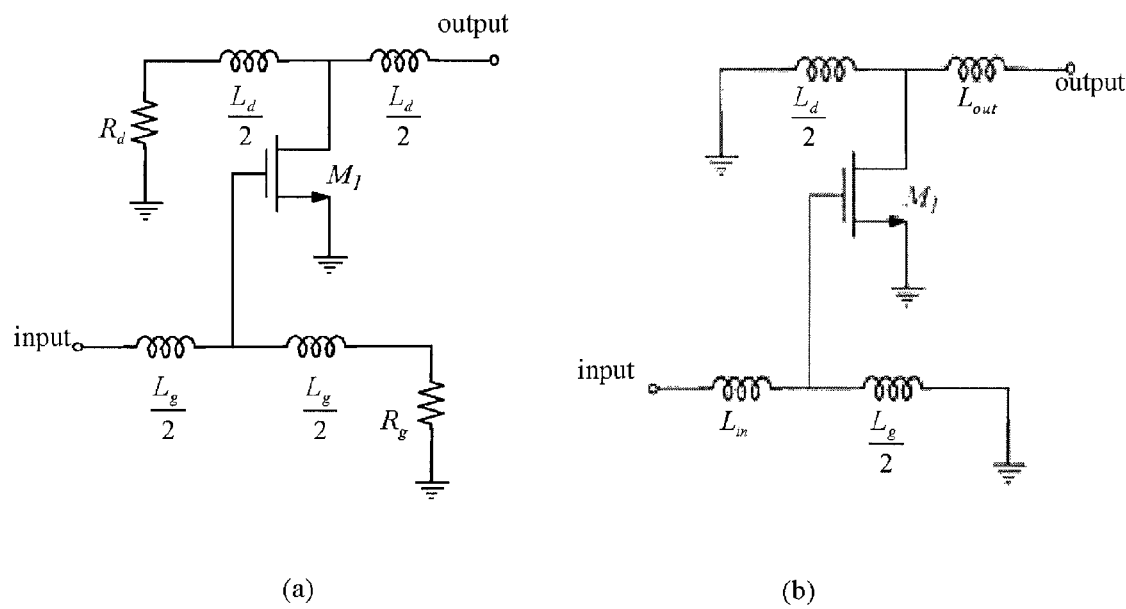
FIG. 4 illustrates a single stage DA implementation to illustrate the invention, in which a) shows a conventional DA and b) the DA of the present invention.

As explained below, and illustrated in FIG. 4 for example, in accordance with the topology of the present invention, conventional termination impedances (usually provided using resistors) are replaced with for example short circuit terminations in both input transmission (gate) and output transmission (drain) lines, resulting in terminated band pass response compared to CDA which has a low pass response. Specifically, in the network topology shown in FIG. 4b for example, the wave goes to the short circuit and returns, which adds up with the initial wave and consequently is a less attenuated signal (than in the case of use of conventional termination impedances) because there is less attenuation on the input and output transmission lines of the circuit. The circuit remains stable because at the circuit's high frequency due to the presence of different loss mechanisms associated with high frequency loss of conductors and dielectric loss tangents, along with presence of ohmic resistance of interconnections, providing substantial stability and prevent oscillation substantially. This stability can be assisted by using known low-cost fabrication methods.

Thus a distributed amplifier circuit with improved characteristics is provided. The distributed amplifier of the present invention produces less noise, better gain performance and significant reductions in circuit size and circuit component requirements. In the distributed amplifier of the present invention, there is no need to replace the inductors with series inductors-capacitors and capacitors with shunt inductor-capacitor. This results in significant savings in the required circuit size, for example reducing the number of capacitors and inductors by a factor of four. In addition, due to the elimination of 50Ω resistors and reduction in the number of capacitors and inductors by a factor of 3, the noise figure improves and the gain increases considerably, as further explained below.

Figure 2:
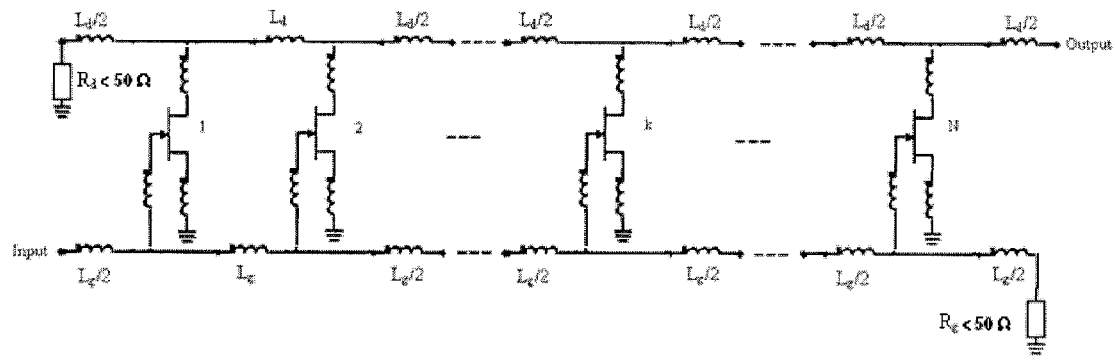
FIG. 2 illustrates the broadband band-pass distributed amplifier (BPDA), in one aspect of the invention.

Also, as shown in FIG. 2, an inductor for example can be placed in the source of amplifying transistor to enhance control over stability, input matching, output matching, noise matching and frequency response.

The present invention also has improved power characteristics because dissipation of power due to terminating impedance is avoided. In many circuits, up to one-half of the power is dissipated due to terminating impedance. Since there is typically both an input and output virtual transmission line, only more than one quarter of the output power is available for a given input signal.

Distributed Amplifier Topology

Figure 1:
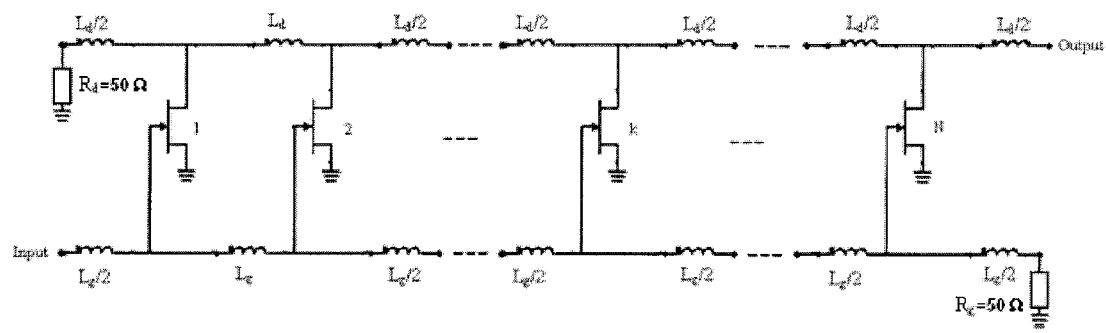
FIG. 1 is a circuit diagram illustrating a prior art, conventional distributed amplifier circuit.

The distributed amplifier consists of a pair of transmission lines connecting the inputs and outputs of two or more active devices. The theory of operation of the circuit illustrated in FIG. 2 is best understood as follows. Each transistor indicated in FIG. 2 includes parasitic capacitors between its input (gate) and output (drain) to the source. These parasitic capacitors limit the bandwidth of the amplifier designed based on the transistor. The idea of a distributed amplifier is to absorb these parasitic capacitors to form the artificial transmission line constructed by inserting inductors between transistors as shown in FIG. 1. The bandwidth of the amplifier is determined by cut-off frequency of these artificial transmission lines which is much higher than the bandwidth of a conventional narrow-band amplifier. The signal injected to the gate line, travels along the gate transmission line and arrives to the gate of each transistor. Then, the amplified signals enter the drain line and add in the forward direction as they travel toward the output. The waves also travel in reverse direction along the drain line and are absorbed in the drain line termination. This results a constant input and output characteristic impedances, thus achieving a wide bandwidth amplification.

The main advantages of a prior art travelling wave amplifier are very wide bandwidth and inherent circuit stability characteristics. However, there are number of known disadvantages to the traveling wave amplifiers: poor output power and therefore low power added efficiency performance, need for multiple active devices, limited gain and noise performances which results in increased complexity and manufacturing cost. The frequency characteristics of the travelling wave amplifier is low pass which is not required in many applications.

The proposed topology in this invention, offers a solution for broadband systems that do not require the low frequency portion of the frequency band. Instead the distributed amplifier of the present invention provides better gain and noise performance, higher output power and power added efficiency and fewer components and therefore lower manufacturing cost.

This is achieved by replacing the termination resistors by for example a short circuit in both gate and drain lines to construct a standing wave amplifier. The termination resistors in a traveling wave amplifier not only dissipate the power but also contribute in the noise figure. In the distributed amplifier of the present invention based on a standing wave construction, the input wave injected to the gate line reflects back by the short circuited termination and adds up with the injected wave to double the gate voltage. Similarly, the output current in the drain line going to the reverse direction is reflected back by the short circuited termination and adds to the forward drain current to double the output current. This results in significant improvement to the output signal overall.

Figure 3:
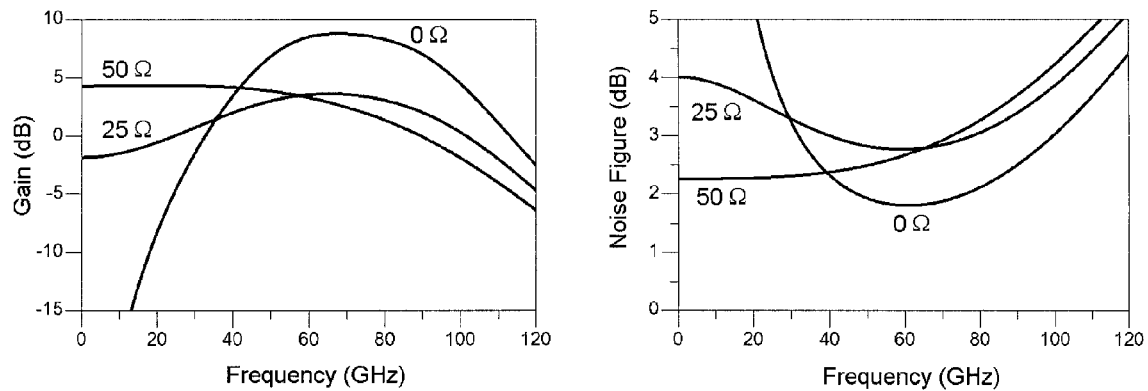
FIG. 3 frequency response comparison of a single-stage BPDA and a single-stage CDA.

FIG. 3 compares the frequency response and the noise performance of a single-stage band pass distributed amplifier in which the terminations have been replaced by $R_d \leq Z_0$ and $R_g \leq Z_0$, with those of the conventional distributed amplifier. In this case, the assumption of no-reflection from termination in conventional distributed amplifier is no longer valid and the amplifier has band pass frequency characteristics.

As can be seen from FIG. 3, the frequency response of a single-stage amplifier is band pass for the case $R_d < Z_0$ and $R_g < Z_0$, however, for $R_g = R_d = Z_0$ (i.e. a conventional distributed amplifier) the amplifier has low pass characteristic. It is clear from FIG. 3 that the band pass distributed amplifier of the present invention has a higher frequency range of operation compared to conventional distributed amplifiers, namely cut-off frequency of 96 GHz BPDA compared to 80 GHz for CDA), and specifically the gain is much higher in high frequencies (8.3 dB at 80 GHz for BPDA compared to 1.3 dB fo CDA) and also low noise figures at high frequency is achieved (namely 2.1 dB at 80 GHz for BPDA compared to 3.3 dB for CDA).

In a particular implementation of the present invention, the transistor parameters are Rgs=7.9Ω, Rds=274Ω, Cgs=100 fF, Cds=50 fF and gm=50 mS which are typical values for a modern high frequency transistor and inductor value is Lg=Ld=200 pH.

The wide bandwidth of the distributed amplifier disclosed herein is another advantage of the distributed amplifier of the present invention. Also, as explained below, the short circuit based terminations disclosed in the distributed amplifier design of the present invention provide more gain and bandwidth.

The distributed amplifier topology of the present invention is explained by reference to a one stage implementation thereof shown in FIG. 4 in b), compared to a one stage implementation of a conventional distributed amplifier in a). As can be seen, in this particular implementation of the invention, the termination impedances were replaced with a short circuit which decreases noise figure of amplifier as we can see later.

Figure 5:
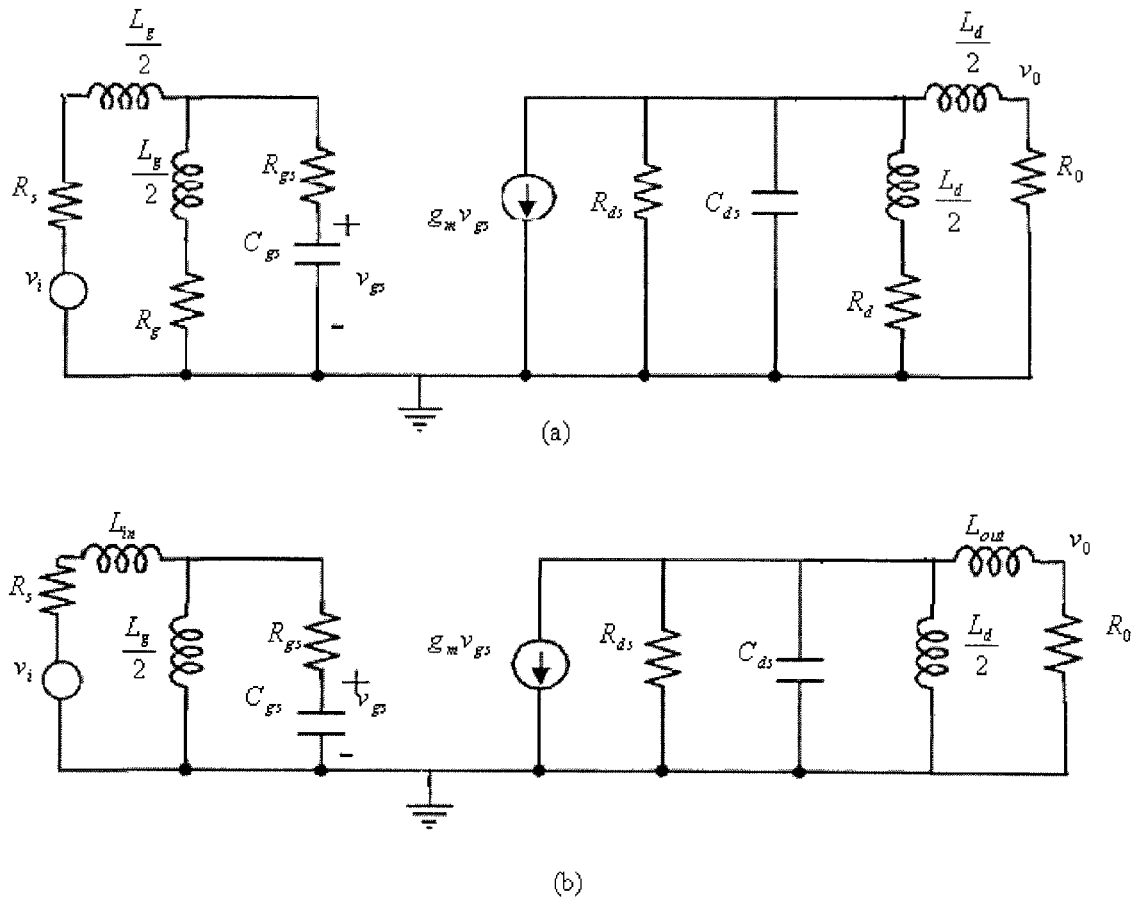
FIG. 5 is a further circuit diagram illustrating in a) a conventional distributed amplifier, and in b) a single-stage distributed amplifier in accordance with the present invention.

Using the transistor model as shown in FIG. 5, the $S_{21}$ of a conventional single-stage distributed amplifier (SSDA) can be calculated. By KVL and KCL in the circuit shown in FIG. 5(a), the gain of the single-stage conventional distributed amplifier for $R_g = R_s$ and $R_d = R_0$ would be:

$$\frac{v_0}{v_i} = -\frac{4g_m R_0 R_{ds}}{[L_d C_{ds} R_{ds} s^2 + (L_d + 2R_0 R_{ds} C_{ds})s + 4R_{ds} + 2R_0]} \quad (3)$$
$$[L_g C_{gs} s^2 + C_{gs}(2R_s + 4R_{gs})s + 4]$$

As can be seen from equation (3) above, SSDA has a low pass frequency characteristic.

To show the frequency response of the distributed amplifier topology of the present invention, the gain of FIG. 4(b) is calculated using simple KVL and KCL and assuming $$L_{in} = \frac{L_g}{2} \text{ and } L_{out} = \frac{L_d}{2}$$

which will be as follows:

$$\frac{v_0}{v_i} = -4R_0 g_m \frac{s^2 L_g L_d R_{ds}}{\begin{bmatrix} s^3 L_g^2 C_{gs} + 2s^2 C_{gs} L_g (2R_{gs} + R_s) + \\ 4s(L_g + R_{gs} C_{gs} R_s) + 4R_s \end{bmatrix}} \times \quad (4)$$

$$\frac{1}{\begin{bmatrix} s^3 L_d^2 R_{ds} C_{ds} + s^2 (L_d^2 + 2L_d R_0 R_{ds} C_{ds}) + \\ 2s(L_d R_0 + 2L_d R_{ds}) + 4R_0 R_{ds} \end{bmatrix}}$$

From equation (4) above, it is readily apparent that the distributed amplifier of the present invention provides band pass frequency response.

Figure 6:
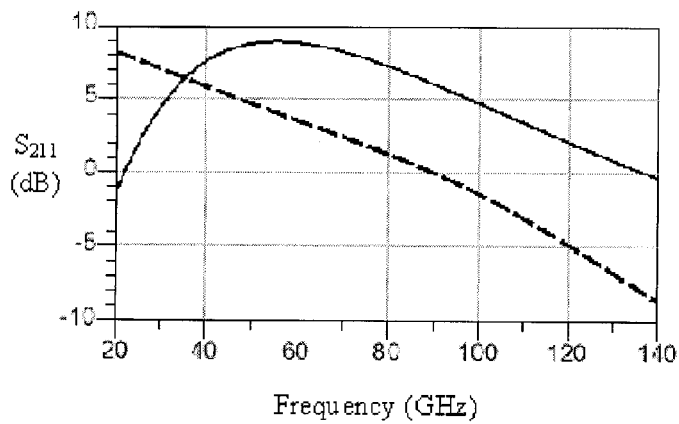
FIG. 6 depicts the frequency response of the proposed topology.

FIG. 6 depicts the frequency response of the distributed amplifier topology of the present invention, in which the solid line indicates the frequency response for a single stage gain cell implementation of a distributed amplifier in accordance with the present invention and the dashed line shows the frequency response for a conventional distributed amplifier.

It should be understood that in distributed amplifiers in accordance with the topology of the present invention, the inductors are lossless. Conventional distributed amplifiers result in relatively high frequency loss because of $R_{gs}$ and $R_{ds}$ resulting in loss in the gate and drain transmission lines, resulting in the inferior performance shown in FIG. 6.

As can be seen from FIG. 6, the frequency response of a distributed amplifier in accordance with the present invention is band pass and the gain is significantly higher than comparable distributed amplifiers in accordance with prior art designs. Significantly, the topology of the present invention does not include noisy resistive terminations for the new topology, resulting in significantly less noise, particularly in comparison to conventional distributed amplifiers in the millimeter frequency range.

To calculate the center frequency and bandwidth of a band pass distributed amplifier in accordance with the present invention, whose frequency response is presented by (4) below and relate these two parameters to the circuit parameters, we divide the (4) into two terms as follow:

$$\frac{v_0}{v_i} = -4g_m R_0 G_1(s) G_2(s).$$

Where:

$$G_1(s) = \frac{L_g s}{[s^3 L_g^2 C_{gs} + 2s^2 C_{gs} L_g (2R_{gs} + R_s) + 4s(L_g + R_{gs} C_{gs} R_s) + 4R_s]}$$

$$G_2(s) = \frac{L_d R_{ds} s}{\begin{bmatrix} s^3 L_d^2 R_{ds} C_{ds} + s^2 (L_d^2 + 2L_d R_0 R_{ds} C_{ds}) + \\ 2s(L_d R_0 + 2L_d R_{ds}) + 4R_0 R_{ds} \end{bmatrix}}$$

As can be seen, $G_1(s)$ and $G_2(s)$ have band pass behaviour. As it is common in band pass filter designs, to calculate the center frequency of each gain function, we should find the frequency at which these functions become real. So we will have:

$$G_1(j\omega) = \frac{j\omega L_g}{j\omega[-\omega^2 L_g^2 C_{gs} + 4(L_g + R_{gs} C_{gs} R_s)] + [4R_s - 2\omega^2 C_{gs} L_g (2R_{gs} + R_s)]} \quad (5)$$

$$\text{Im}[G_1(j\omega)] = 0 \rightarrow 4R_s - 2\omega_{01}^2 C_{gs} L_g (2R_{gs} + R_s)$$
$$= 0 \rightarrow \omega_{01}$$
$$= \sqrt{\frac{2R_s}{C_{gs} L_g (2R_{gs} + R_s)}} \rightarrow$$

$$f_{01} = \frac{1}{2\pi} \sqrt{\frac{2R_s}{C_{gs} L_g (2R_{gs} + R_s)}}$$

$$G_2(j\omega) = \frac{L_d R_{ds}(j\omega)}{j\omega[-\omega^2 L_d^2 R_{ds} C_{ds} + 2(L_d R_0 + 2L_d R_{ds})] + [4R_0 R_{ds} - \omega^2 (L_d^2 + 2L_d R_0 R_{ds} C_{ds})]} \quad (6)$$

$$\text{Im} G_2(j\omega) = 0 \rightarrow 4R_0 R_s - \omega_{02}^2 (L_d^2 + 2L_d R_0 R_{ds} C_{ds})$$
$$= 0 \rightarrow \omega_{02}$$
$$= 2\sqrt{\frac{R_0 R_{ds}}{L_d (L_d + 2R_0 R_{ds} C_{ds})}} \rightarrow$$

$$f_{02} = \frac{1}{\pi} \sqrt{\frac{R_0 R_{ds}}{L_d (L_d + 2R_0 R_{ds} C_{ds})}}$$

Therefore the bandwidth of the amplifier is $f_{02}-f_{01}$, and the center frequency of the band pass amplifier is $$f_0 = \frac{f_{01} + f_{02}}{2}.$$

It is interesting to note that $f_{01}$ is the function of gate parameters only (input) and $f_{02}$ is the function of drain parameters (output). For example to design a band pass DA to work from 80 GHz to 86 GHz, we choose $L_g$ for $f_{01}$=80 GHz and $L_a$ for $f_{02}$=86 GHz.

It is also interesting to see that in the topology of the present invention one can choose L=0 and $L_{out}$=0. In this case, the frequency response of our proposed topology reduces to:

$$\frac{v_0}{v_i} = -R_0 g_m \frac{s^2 L_g L_d R_{ds}}{[C_{gs} L_g (R_{gs} + R_s)s^2 + (L_g + 2R_{gs} C_{gs} R_s)s + 2R_s]} \times \quad (7)$$
$$\frac{1}{[L_d R_0 R_{ds} C_{ds} s^2 + L_d (R_0 + R_{ds})s + 2R_0 R_{ds}]}$$

To find the center frequency and bandwidth of the amplifier we repeat the calculation as we carried out previously by writing the (7) as follow:

$$\frac{v_0}{v_i} = -R_0 g_m G_1(s) G_2(s)$$

Where:

$$G_1(s) = \frac{L_g s}{[C_{gs} L_g (R_{gs} + R_s)s^2 + (L_g + 2R_{gs} C_{gs} R_s)s + 2R_s]}$$

and $$G_2(s) = \frac{R_{ds} L_d s}{[L_d R_0 R_{ds} C_{ds} s^2 + L_d (R_0 + R_{ds})s + 2R_0 R_{ds}]}$$

To calculate the center frequency of each gain function, we should find the frequency at which these functions become real. So we will have:

$$G_1(j\omega) = \frac{L_g(j\omega)}{[(2R_s - C_{gs} L_g (R_{gs} + R_s)\omega^2 + (L_g + 2R_{gs} C_{gs} R_s)j\omega]} \rightarrow \quad (8)$$
$$\text{Im}(G_1(j\omega)) = 0 \rightarrow$$
$$\omega_{01} = \sqrt{\frac{2R_s}{C_{gs} L_g (R_{gs} + R_s)}} \rightarrow$$
$$f_{01} = \frac{1}{2\pi} \sqrt{\frac{2R_s}{C_{gs} L_g (R_{gs} + R_s)}}$$

$$G_2(j\omega) = \frac{R_{ds} L_d(j\omega)}{[-L_d R_0 R_{ds} C_{ds}\omega^2 + L_d (R_0 + R_{ds})j\omega + 2R_0 R_{ds}]} \quad (9)$$
$$\text{Im}(G_2(j\omega)) = 0 \rightarrow$$
$$\omega_{02} = \sqrt{\frac{2}{L_d C_{ds}}} \rightarrow$$
$$f_{02} = \frac{1}{2\pi} \sqrt{\frac{2}{L_d C_{ds}}}$$

The above equations show that $f_{o1}$ and $f_{o2}$ are determined by $L_g$ and $L_d$ respectively.

Figure 7:
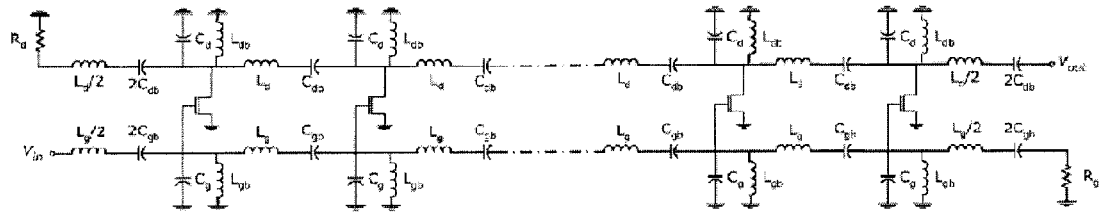
FIG. 7 illustrates a conventional band pass distributed amplifier using a low pass to band pass transformation method.

In conventional distributed amplifiers, to obtain a band pass distributed amplifier, each inductor is replaced with series combinations of an inductor-capacitor, such that each capacitor is replaced with parallel combinations of an inductor-capacitor as shown in FIG. 7. As can be seen from FIG. 7, the circuit size for a prior art band pass distributed amplifier is relatively large (adding to the cost associated with the number of circuit components required and resulting in relatively large on-chip space being required) and difficult to implement in MMIC technology. In addition, the large number of capacitors and inductors deteriorates the performance of the amplifier due to low quality factor of on-chip capacitors and inductors. It should also be noted that usually the band pass transformation creates large inductor and capacitor values which makes the circuit size even larger and more difficult to implement. Moreover, the bias of prior art circuits is not easily possible due to the series of capacitors and because of the need for a relatively complicated arrangement required for biasing.

Figure 8:
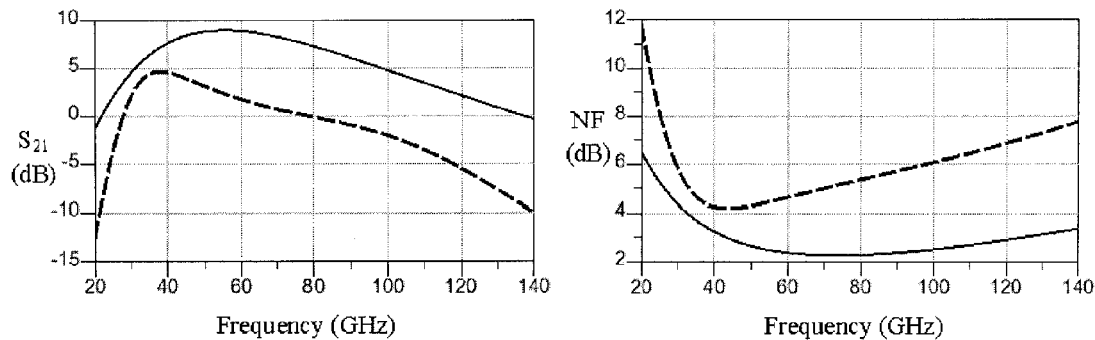
FIG. 8 shows a comparison of the gain and noise figures of the topology of the present invention (solid line) with those of conventional band pass DA (dashed line) for a single stage cell.

FIG. 8 depicts the comparison between a) the gain and b) the noise figure of the topology of the present invention with those of conventional band pass distributed amplifiers, showing the significant improvement provided by the present invention.

Figure 9:
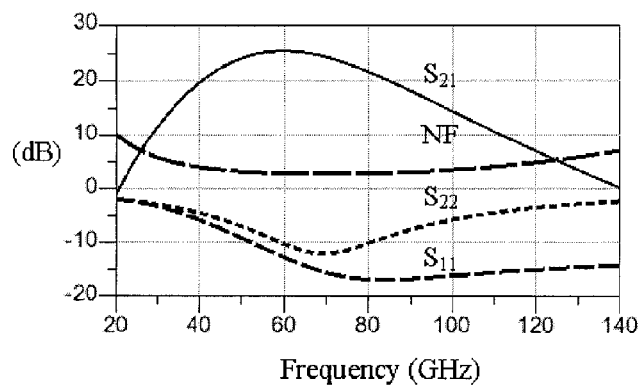
FIG. 9 shows the S-parameters and noise figures of the band pass topology in accordance with the present invention.

Based on the topology of the present invention, a 3 single stage cascaded distributed amplifier was created (3-SSDA). FIG. 9 shows the simulated S-parameters of this amplifier. Simulation based on the measured S-parameter for each component verifies the band pass frequency response characteristic of the topology of the present invention, and its ability to operate at higher frequency range.

The structure of a distributed amplifier in accordance with the present invention depends on the gain requirements. Six to seven gain cells are typical but for many applications less are sufficient. A variety of fabrication methods may be used for example CMOS (complementary metal-oxide semiconductor) fabrication. It should be understood that the advantageous characteristics of the distributed amplifier of the present invention are a good fit with CMOS fabrication techniques because CMOS works well for lossy and high frequency circuits, and provides desirable stability characteristics to the distributed amplifier disclosed herein.

The distributed amplifier of the present invention may be implemented as an RF section, and more specifically as an RF front end. The RF section may be used in a variety of applications such as any RF components (including antennas).

It should be understood that the novel distributed amplifier of the present invention may be used for millimeter wave applications, but also sub millimeter wave applications.

The present invention contemplates various other circuits and electronic devices which include or are based on the distributed amplifier and circuit disclosed herein.

The invention has been shown with reference to the specific embodiments. However, it should be noted that the invention is in no way limited to the details of the illustrated structures but changes and modifications may be made within the scope of the claims. For example, various alternate circuit implementations are possible that draw on the circuit design principles explained above. Distributed amplifiers in accordance with the present invention may be integrated with various other circuits or circuit elements.

The invention claimed is:

1. A distributed amplifier comprising: an input transmission line and an output transmission line, and one or more unit cells disposed in sequence and connected to both the input transmission line and the output transmission line, each of the unit cells having amplifying characteristics, characterized in that:
    the termination impedance of the input transmission line is not matched with the characteristics impedance of the input transmission line; and/or
    the termination impedance of the output transmission line is not matched with the characteristics impedance of the output transmission line,
    such that the distributed amplifier is broadband and band pass with controllable bandwidth,
    wherein the distributed amplifier includes at least one short circuit for signal termination disposed at the end of one or more of the input transmission line, and the output transmission line.

2. The distributed amplifier of claim 1, characterized in that:
    the termination impedance of the input transmission line is less than the characteristics impedance of the input transmission line; and/or the termination impedance of the output transmission line is less than the characteristics impedance of the output transmission line.

3. The distributed amplifier of claim 1, characterized in that the circuit of the distributed amplifier is based on a standing wave amplifier construction.

4. The distributed amplifier of claim 1, characterized in that signal termination is provided by short circuit terminations disposed on both the input transmission line and the output transmission line.

5. The distributed amplifier of claim 1, characterized in that each of the unit cells includes at least one transistor, each such transistor including one or more parasitic capacitors, and wherein such parasitic capacitors are absorbed on each of the input transmission line and the output transmission line so as to provide a large bandwidth transmission line.

6. The distributed amplifier of claim 5, characterized in that the bandwidth of the distributed amplifier is determined by the cut-off frequency of the input transmission line and the output transmission line based on the termination(s) of the distributed amplifier.

7. The distributed amplifier of claim 6, characterized in that the bandwidth is controllable including through the selection of the termination(s).

8. The distributed amplifier of claim 1, characterized in that in the distributed amplifier circuit:
    (a) a signal is injected to the input transmission line;
    (b) the signal travels to each unit cell; and
    (c) the signal is amplified in each unit cell by addition in travelling in the forward direction toward a circuit output so as to generate an amplified output signal;
    wherein the signal is also reflected by the termination disposed on the input transmission line back to its input transmission line, thereby adding up to the injected signal; and/or
    wherein the signal travels in the reverse direction along the output transmission line, and is reflected by the termination disposed on the output transmission line back to its output transmission line thereby further adding up to output signal.

9. The distributed amplifier of claim 8 wherein the adding up provides improved gain and noise performance and reduces power consumption.

10. The distributed amplifier of claim 8, characterized in that the circuit produces a signal with substantially less attenuation thereby providing less attenuation at the termination(s).

11. The distributed amplifier of claim 8, characterized in that the stronger output signal and injected signal enables the reduction of the number of unit cells required for gain and bandwidth requirements.

12. The distributed amplifier of claim 1, characterized in that it provides inherent circuit stability characteristics.

13. An electronic device characterized in that it includes one or more distributed amplifier circuits of claim 1.

* * * * *